(12) United States Patent
Wan et al.

(10) Patent No.: US 11,915,933 B2
(45) Date of Patent: Feb. 27, 2024

(54) MANUFACTURING METHOD OF SEMICONDUCTOR STRUCTURE

(71) Applicant: CHANGXIN MEMORY TECHNOLOGIES, INC., Hefei (CN)

(72) Inventors: Qiang Wan, Hefei (CN); Tao Liu, Hefei (CN); Sen Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 427 days.

(21) Appl. No.: 17/404,222

(22) Filed: Aug. 17, 2021

(65) Prior Publication Data
US 2022/0093400 A1    Mar. 24, 2022

Related U.S. Application Data

(63) Continuation of application No. PCT/CN2021/100031, filed on Jun. 15, 2021.

(30) Foreign Application Priority Data

Sep. 18, 2020    (CN) .......................... 202010984443.4

(51) Int. Cl.
*H01L 21/033*    (2006.01)
(52) U.S. Cl.
CPC ...... *H01L 21/0338* (2013.01); *H01L 21/0332* (2013.01); *H01L 21/0335* (2013.01); *H01L 21/0337* (2013.01)
(58) Field of Classification Search
CPC ............. H01L 21/0338; H01L 21/0332; H01L 21/0335; H01L 21/0337
See application file for complete search history.

(56) References Cited

U.S. PATENT DOCUMENTS

| | | | |
|---|---|---|---|
| 9,287,124 B2 * | 3/2016 | Kong | H01L 21/0332 |
| 9,899,515 B1 | 2/2018 | Cheng et al. | |
| 9,941,121 B1 * | 4/2018 | Engelmann | H01L 21/0273 |
| 10,475,692 B2 | 11/2019 | Licausi et al. | |
| 10,559,502 B2 | 2/2020 | Cheng et al. | |
| 10,607,894 B2 | 3/2020 | Cheng et al. | |
| 10,629,451 B1 | 4/2020 | Guo et al. | |
| 10,734,287 B2 | 8/2020 | Cheng et al. | |
| 10,964,601 B2 | 3/2021 | Cheng et al. | |
| 10,964,602 B2 | 3/2021 | Cheng et al. | |
| 2006/0223327 A1 * | 10/2006 | Kim | H01L 21/31116 257/E21.252 |
| 2010/0203740 A1 * | 8/2010 | Li | H01L 21/3088 438/736 |

(Continued)

FOREIGN PATENT DOCUMENTS

| | | |
|---|---|---|
| CN | 102347232 A | 2/2012 |
| CN | 110911344 A | 3/2020 |

*Primary Examiner* — Eugene Lee
(74) *Attorney, Agent, or Firm* — Cooper Legal Group, LLC

(57) ABSTRACT

A manufacturing method of a semiconductor structure is disclosed, which includes: an initial structure is provided; a filling layer covering a spacer is formed on the initial structure; a filling layer with a first preset thickness is removed at a high first etching rate through a first etching process, then a filling layer with a second preset thickness is removed at a low second etching rate through a second etching process, and the partial spacer is exposed; and the filling layer and the spacer are patterned.

10 Claims, 4 Drawing Sheets

(56) References Cited

U.S. PATENT DOCUMENTS

| | | | |
|---|---|---|---|
| 2010/0270652 A1* | 10/2010 | Kim | G03F 7/0035 |
| | | | 257/618 |
| 2010/0285669 A1* | 11/2010 | Shima | H01L 21/32139 |
| | | | 257/E21.218 |
| 2011/0059617 A1* | 3/2011 | Mitchell | H01J 37/32357 |
| | | | 438/723 |
| 2015/0380256 A1* | 12/2015 | Chang | H01L 21/31144 |
| | | | 438/702 |
| 2016/0079088 A1* | 3/2016 | Agarwal | H01L 21/02071 |
| | | | 438/734 |
| 2018/0122706 A1 | 5/2018 | Cheng et al. | |
| 2018/0122936 A1 | 5/2018 | Cheng et al. | |
| 2018/0122938 A1 | 5/2018 | Cheng et al. | |
| 2018/0294267 A1 | 10/2018 | Licausi et al. | |
| 2020/0006112 A1 | 1/2020 | Licausi et al. | |
| 2020/0168510 A1 | 5/2020 | Cheng et al. | |
| 2020/0168511 A1 | 5/2020 | Cheng et al. | |
| 2020/0168512 A1 | 5/2020 | Cheng et al. | |
| 2022/0216050 A1* | 7/2022 | Yu | H01L 21/02274 |
| 2023/0118701 A1* | 4/2023 | Tan | H01L 21/31144 |
| | | | 438/723 |

* cited by examiner

MANUFACTURING METHOD OF SEMICONDUCTOR STRUCTURE

CROSS-REFERENCE TO RELATED APPLICATIONS

This application is a continuation of International patent application No. PCT/CN2021/100031, filed on Jun. 15, 2021, which is filed based upon and claims priority to Chinese patent application No. 202010984443.4, filed on Sep. 18, 2020. The contents of International patent application No. PCT/CN2021/100031 and Chinese patent application No. 202010984443.4 are incorporated herein by reference in their entireties.

TECHNICAL FIELD

The disclosure relates to the field of manufacturing a semiconductor device, and in particular to a manufacturing method of a semiconductor structure.

BACKGROUND

With the evolution of semiconductor technology nodes and equipment, chip manufacturers continue to challenge increasing the density of devices on wafers with cost considerations, the density of devices in integrated circuits is increasing, critical dimensions (CD) of semiconductor devices are decreasing, and have approached optical and physical limits of photolithography. Mask patterns formed by existing photolithography processes are difficult to meet requirements of continuously decreasing CDs of semiconductor devices, and the development of a semiconductor technology is limited.

In order to further reduce the dimension of a semiconductor device on the basis of the existing photolithography process, a self-aligned double patterning (SADP) process, which includes mandrel and spacer processes, is generated. The principle includes: forming spacers on both sides of a mandrel pattern in advance, removing the mandrel pattern to transfer spacer patterns to a target material layer, and achieving a target pattern.

However, in a semiconductor process, polymer residues may be formed on a surface of a film layer when some film layers are etched. Dry etching is taken as an example, in the dry etching, etching is typically performed using a gas containing fluorocarbon plasma. The adopted gas includes carbon tetrafluoride (CF4), C4F8, C5F8, or C4F6, which may be used as a reaction gas for providing carbon atoms and fluorine atoms. Etching with such gases typically produces a carbon (C)-based polymer after the etching process. If the remaining polymer is not removed, subsequent processes may be affected. For example, film layers subsequently formed may be defective, such as bumps, which affect product yield and productivity.

SUMMARY

In a first aspect, the disclosure discloses a manufacturing method of a semiconductor structure, which includes: providing an initial structure including a base, a mask layer formed on the base, and a spacer formed on the mask layer; forming a filling layer covering the spacer on the initial structure; removing a filling layer with a first preset thickness through a first etching process, where the remaining filling layer after the first etching process may cover the spacer, and a first etching rate may be adopted in the first etching process; removing a filling layer with a second preset thickness through a second etching process, and exposing the partial spacer to remove carbon-based polymers at a boundary of at least the partial filling layer, or a boundary of the filling layer and the spacer, or the boundary of at least the partial filling layer and the boundary of the filling layer and the spacer; where a second etching rate may be adopted in the second etching process, and the second etching rate may be smaller than the first etching rate; and patterning the filling layer and the spacer.

BRIEF DESCRIPTION OF THE DRAWINGS

Specific features of the disclosure referred to herein are set forth in the appended claims. The characteristics and advantages of the disclosure referred to herein may be better understood by reference to the following detailed description of exemplary implementations and the accompanying drawings. The brief description of the drawings is as follows.

DETAILED DESCRIPTION

Figure 1:
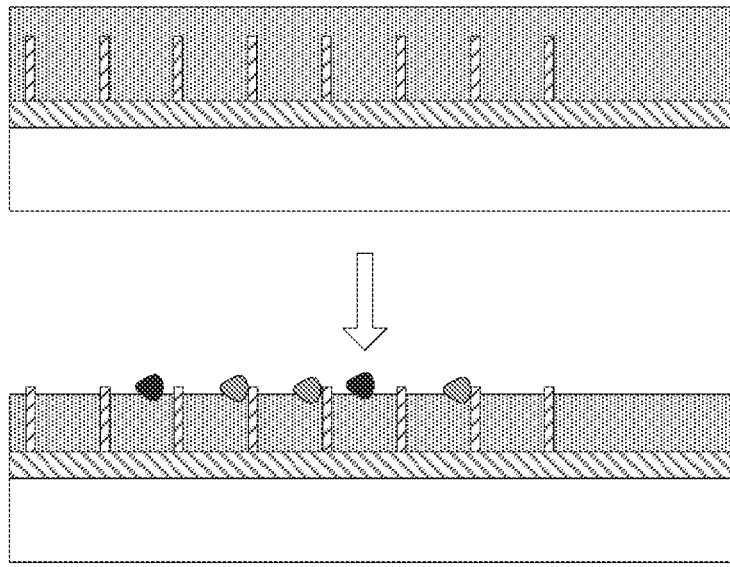
FIG. 1 shows a schematic diagram of polymer residues on a corresponding film layer after an etching process in a related art.

The implementations of the disclosure are described below by way of specific examples, and other advantages and efficiencies of the disclosure will become readily apparent to those skilled in the art from the disclosure of this specification.

Example implementations will now be described more fully with reference to the accompanying drawings. However, the example implementations can be implemented in a variety of forms and should not be construed as limited to the implementations set forth herein. Rather, these implementations are provided so that the disclosure will be thorough and complete, and the concepts of the example implementations are fully communicated to those skilled in the art. The same reference numerals in the figures indicate the same or similar structures, and thus the detailed descriptions thereof are omitted.

Although relative terms, such as "on" and "under", are used in this specification to describe the relative relationship between one component of an icon and another component, these terms are used in this specification only for convenience, for example, according to the directions of the examples described in the drawings. It will be appreciated that if a device of the icon is flipped upside down, a component described as being "on" another component will become a component described as being "under" another component. When a structure is located "on" other structures, it may mean that the structure is integrally formed on other structures, or the structure is "directly" disposed on other structures, or the structure is "indirectly" disposed on other structures through another structure.

The terms "one", "a/an", "the", and "said" are used to indicate the presence of one or more elements/components/etc. The terms "including" and "having" are used in an open-type inclusive sense and mean that there may be additional elements/components/etc. in addition to the listed elements/components/etc. The terms "first" and "second" are used merely as labels and are not intended to limit the number of objects.

In a semiconductor process, polymer residues may be formed on a surface of a film layer when some film layers are etched. For example, in a manufacturing process of a semiconductor structure, a spacer and a film layer covering the spacer are formed on a semiconductor base. Then, the film layer is etched to expose the spacer originally covered by the film layer. But since a reaction gas provided in an etching process contains carbon elements, polymer residues of corresponding elements exist after the etching process. FIG. 1 shows a schematic diagram of polymer residues on a corresponding film layer after an etching process in a related art. As illustrated in FIG. 1, since the reaction gas contains carbon atoms, after the process of etching the film layer and exposing the spacer, carbon-based polymers remain. For example, C polymers remain on the surface of the film layer, and hard C remains at a boundary of the film layer and the spacer. These carbon-based polymers cause defects in the subsequently formed film layer, such as bumps and the like, which may affect product yield and productivity. Therefore, how to effectively eliminate polymer residues is an urgent problem to be solved in the industry.

In view of this, the disclosure discloses a manufacturing method of a semiconductor structure, which can eliminate or reduce polymer residues by improving an existing etching process so as to facilitate the stability of a subsequent process technology and improve the quality of products.

An execution body of the disclosure may be a semiconductor device, which is not limited in embodiments of the disclosure.

Figure 2:
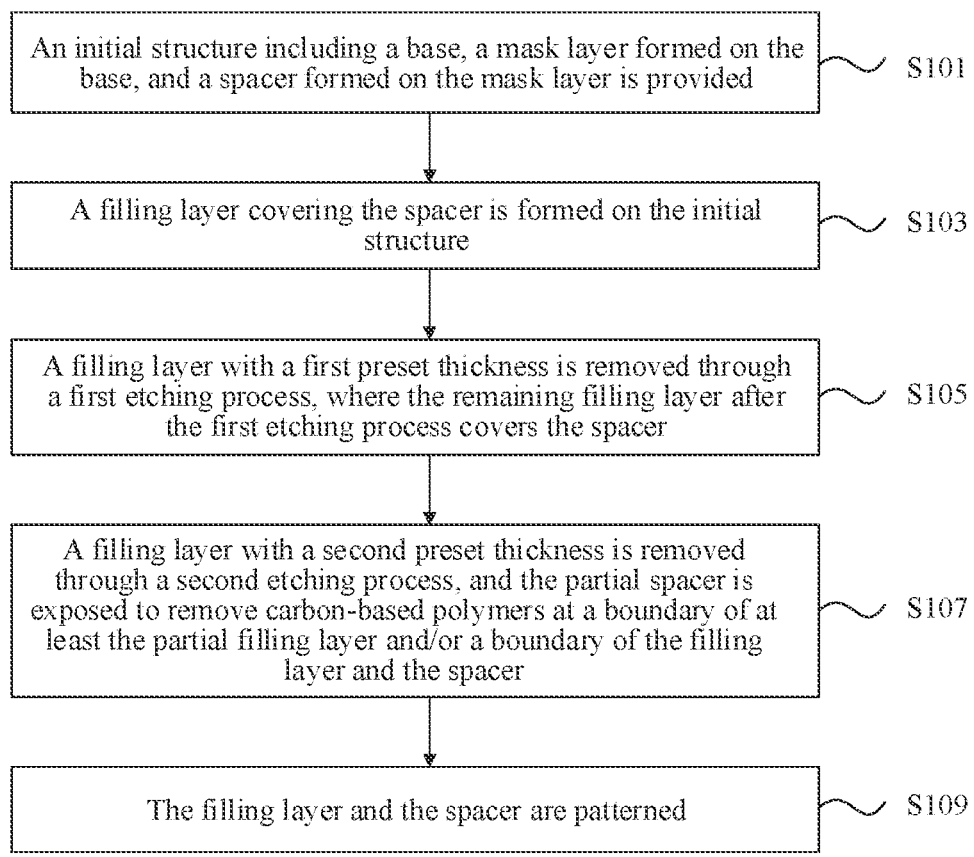
FIG. 2 is a flow chart showing a manufacturing method of a semiconductor structure according to the disclosure.

FIG. 2 is a flow chart showing a manufacturing method of a semiconductor structure according to the disclosure. As illustrated in FIG. 2, the manufacturing method of the semiconductor structure includes as follows.

At S101, an initial structure including a base, a mask layer formed on the base, and a spacer formed on the mask layer is provided.

At S103, a filling layer covering the spacer is formed on the initial structure.

At S105, a filling layer with a first preset thickness is removed through a first etching process. The remaining filling layer after the first etching process covers the spacer.

At S107, a filling layer with a second preset thickness is removed through a second etching process, and the partial spacer is exposed to remove carbon-based polymers at a boundary of at least the partial filling layer and/or a boundary of the filling layer and the spacer.

At S109, the filling layer and the spacer are patterned.

The manufacturing method of the semiconductor structure disclosed in the disclosure will now be described in detail with reference to the accompanying drawings.

Firstly, the semiconductor device executes operation S101 in which an initial structure including a base, a mask layer formed on the base, and a spacer formed on the mask layer is provided.

In some embodiments of the disclosure, the semiconductor structure is manufactured using a double patterning process, such as an SADP process.

Taking the SADP process as an example, the base has a known patterned layer stack designed for SADP. Here, the base may include monocrystalline silicon, an oxide layer, a polycrystalline silicon layer, silicon germanium, silicon on insulator, etc. The base may further include a stacked composite structure of various materials, such as a combination of silicon nitride, silicon oxide, silicon carbonitride, or silicon oxynitride. In a structure illustrated in FIG. 1, only a base layer 201 is shown as a schematic illustration.

A mask layer may be formed on the base layer 201. The mask layer may be a single-layer structure or a multi-layer structure. The material of the mask layer may include, but is not limited to, silicon oxynitride (SiON), polycrystalline silicon (Poly), an ACL, oxide, etc. In the embodiment illustrated in FIG. 3, a polishing layer adopts a double-layer structure consisting of an ACL and a silicon oxynitride (SiON) layer. That is, an ACL 202 and a SiON layer 203 are sequentially formed on the base layer 201. The ACL 202 may be formed by using a chemical vapor deposition (CVD) process or a spin-on dielectrics (SOD) process. The SiON layer 203 may also serve as a subsequent etching stop layer.

In addition, a spacer 205 is formed on the mask layer. That is, in the embodiment illustrated in FIG. 3, a spacer 205 is formed on the SiON layer 203. In some embodiments of the disclosure, the manufacturing process for forming the spacer 205 may include as follows. A mandrel layer is formed on a surface of the mask layer. The mandrel layer is patterned to form mandrels arranged at intervals. A spacer material layer is formed on the surfaces of the mask layer and the mandrels. The spacer material layer is etched back by adopting a plasma etching process until the tops of the mask layer and the mandrels are exposed. Spacer materials on both sides of the mandrels are retained as a spacer. The mandrels are removed to form the spacer.

The material of the spacer 205 may be an oxide material, a dielectric material, etc.

Figure 3:
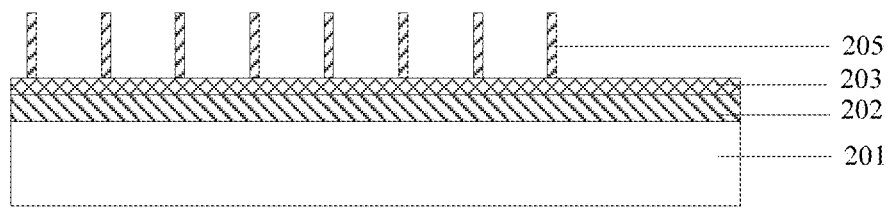
FIG. 3 shows a first schematic diagram of a structural change for manufacturing a semiconductor structure according to operations of FIG. 2.

After operation S01, a structure illustrated in FIG. 3 is formed.

Next, the semiconductor device executes operation S103 in which a filling layer covering the spacer is formed on the initial structure.

Figure 4:
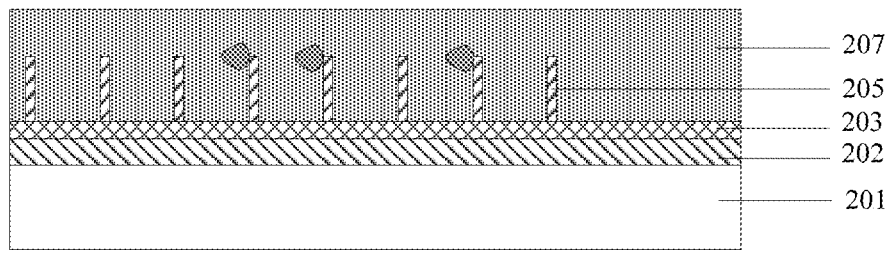
FIG. 4 shows a second schematic diagram of a structural change for manufacturing a semiconductor structure according to operations of FIG. 2.

In some embodiments of the disclosure, at S103, a filling layer 207 is formed on the surface of the mask layer (i.e., the SiON layer 203) until the spacer 205 is completely covered, and a structure as illustrated in FIG. 4 is formed.

The filling layer 207 may be formed of a spin on hardmask (SOH) layer. The SOH layer may be formed by a spin-on process and may be an insulating layer of a carbon hydrogen (CxHy) system, which may include a silicon hardmask material, a carbon hardmask material, an organic hardmask material, etc. In addition, the filling layer 207 completely covers the spacer 205, and the thickness of the filling layer 207 may be about 80 nm, for example, in the range of 70 nm to 150 nm. In practice, the thickness of the filling layer 207 is not limited thereto and may vary differently depending on the height of the spacer 205, mainly in that the spacer 205 may be completely covered. Alternatively, the filling layer 207 may also be formed of, for example, photoresist or amorphous silicon.

Still taking the SOH layer as an example, the material of the SOH layer has characteristics of strong viscosity, poor fluidity, etc., so that aggregated particles of C, i.e., hard C, are easily aggregated for the surface of oxide. As can be seen from FIG. 4, during the formation of the filling layer 207 using the SOD process, a filling material generates hard C residues at a boundary with the spacer 205 (the material of the spacer 205 may be, e.g., an oxide material).

Next, the semiconductor device executes operation S105 in which a filling layer with a first preset thickness is removed through a first etching process. The remaining filling layer after the first etching process covers the spacer.

Figure 5:
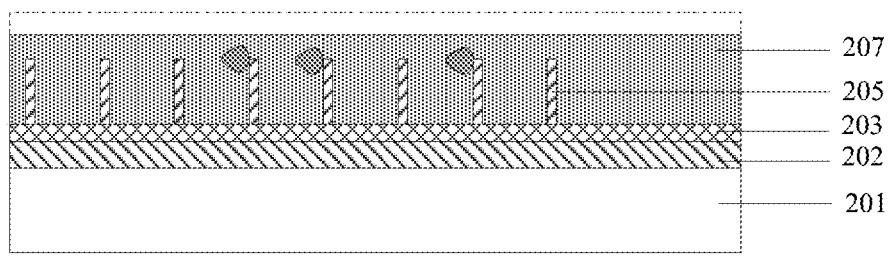
FIG. 5 shows a third schematic diagram of a structural change for manufacturing a semiconductor structure according to operations of FIG. 2.

In some embodiments of the disclosure, at S105, the semiconductor device performs a first etching process to remove a filling layer with a second preset thickness. The remaining filling layer 207 after the first etching process still covers the spacer 205, and a structure as illustrated in FIG. 5 is formed.

In the embodiments of the disclosure, operation S105 is a preliminary operation with respect to the subsequent operation S107, mainly for removing a portion, covering the spacer 205, of the filling layer 207; i.e., a portion of the filling layer 207 higher than the spacer 205, so that the top of filling layer after removing is as close as possible to the top of the spacer. For example, in practical application, according to the height of the spacer 205 and the height of the filling layer 207 formed at S103, a height difference H1 between the spacer 205 and the filling layer 207 formed at S103 may be acquired. Subsequently, a first preset thickness of the partial filling layer to be removed using the first etching process is determined according to the height difference H1.

At S105, parameters of the first etching process include: a power is 100 W to 300 W, which may further be 150 W to 250 W, and an etching gas includes oxygen having a flow rate of 12 sccm to 18 sccm (standard ml/min), e.g. 15 sccm, and an etching rate of 0.5 nm/s to 5 nm/s, further 0.6 nm/s to 1.5 nm/s, preferably 0.8 nm/s. The filling layer material with a second preset thickness may be removed using the first etching process. The second preset thickness may be, e.g., about 15 nm (nanometer), e.g. in the range of 12 nm to 18 nm.

The semiconductor device executes operation S105, so that the portion of the filling layer above the spacer 205 may be removed as much as possible, the execution of the subsequent operation S105 is facilitated, and the efficiency is improved.

Next, the semiconductor device executes operation S107 in which a filling layer with a second preset thickness is removed through a second etching process, and the partial spacer is exposed to remove carbon-based polymers at a boundary of at least the partial filling layer and/or a boundary of the filling layer and the spacer.

Figure 6:
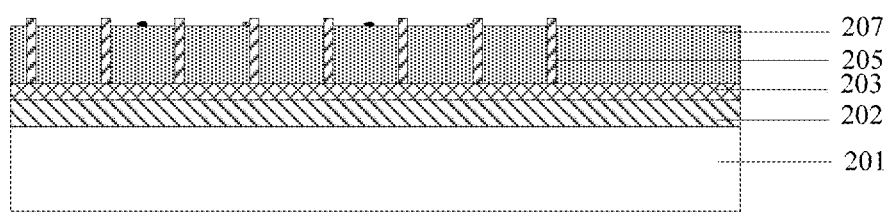
FIG. 6 shows a fourth schematic diagram of a structural change for manufacturing a semiconductor structure according to operations of FIG. 2.

In some embodiments of the disclosure, at S107, the semiconductor device performs a second etching process to remove a filling layer with a second preset thickness, and the partial spacer is exposed. A structure as illustrated in FIG. 6 is formed.

At S107, parameters of the second etching process include: a power is 100 W to 300 W, which may further be 150 W to 250 W, and an etching gas includes nitrogen having a flow rate of 18 sccm to 22 sccm (standard ml/min), e.g. 20 sccm, and an etching rate of 0.1 nm/s to 0.5 nm/s. Through the second etching process, the filling layer material with the second preset thickness may be removed, and the partial spacer is exposed. That is, the top of the spacer 205 is exposed from the filling layer 207. In an embodiment of the disclosure, the top of the spacer 205 is higher than the filling layer 207, e.g., about 2 nm (nanometer), or in the range of, e.g., 1 nm to 3 nm. That is, a height difference H2 between the filling layer 207 and the top of the spacer 205 after performing the second etching process at S107 is 1 nm to 3 nm.

As described above, since the SOH layer as the filling layer 207 has a strong material viscosity and poor fluidity, aggregated particles of C, i.e., hard C, are easily formed by aggregating at a boundary with the spacer 205. Therefore, the filling layer material with the second preset thickness is removed, and the partial spacer is exposed at S107. Thus, carbon-based polymers originally aggregated at a boundary of the filling layer 207 and the top of the spacer 205 can be removed.

In addition, compared with operation S105, when operation S107 is executed, the second etching rate adopted in the second etching process is smaller than the first etching rate adopted in the first etching process. The etching time is prolonged by reducing the etching rate. The filling layer 207 is slowly etched, so that plasma used in the etching process can fully react without remaining on the surface of the film layer. Meanwhile, nitrogen plasma is used for slowly and vertically bombarding downwards, and since the hardness of the filling layer and the carbon-based polymers is smaller than that of the spacer material, the filling layer and the carbon-based polymers are etched downwards simultaneously, so that the carbon-based polymers can be removed simultaneously while the filling layer is etched. Taking the filling layer 207 in the present embodiment as an example, when executing operation S107, the carbon-based polymers at a boundary of at least the partial filling layer may be removed in the process of removing the filling layer with the second preset thickness and exposing the partial spacer by using the second etching process, so as to ensure the quality of a formed film layer in a subsequent process technology of the film layer.

Figure 7:
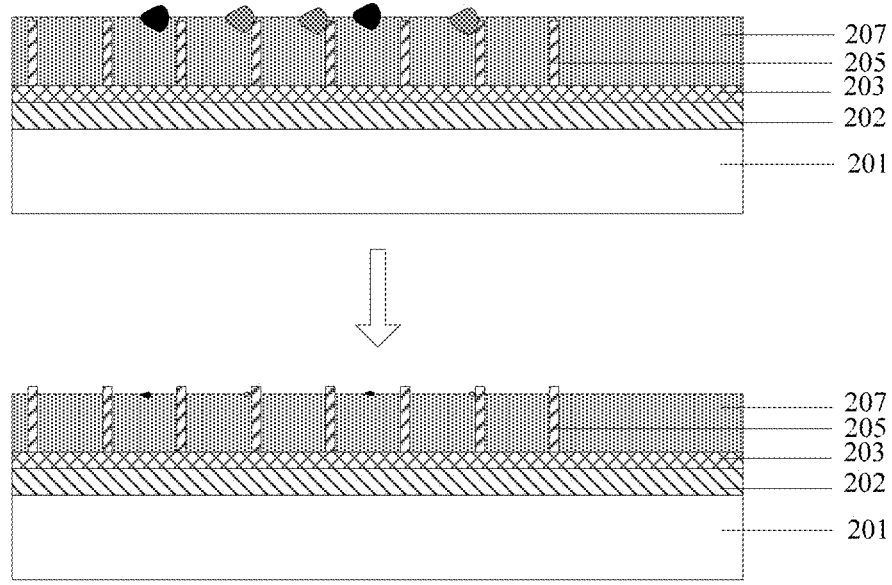
FIG. 7 shows a fifth schematic diagram of a structural change for manufacturing a semiconductor structure according to operations of FIG. 2.

The carbon-based polymers include a C polymer remaining on the surface of the film layer and hard C remaining at a boundary of the film layer and the spacer. Therefore, the operation of removing carbon-based polymers at a boundary of at least the partial filling layer and/or a boundary of the filling layer and the spacer may include as follows. The C polymer at the boundary of the filling layer is removed or partially removed, and hard C remaining at the boundary of the film layer and the spacer is removed or partially removed, referring to a schematic diagram of a structural change illustrated in FIG. 7.

Next, the semiconductor device executes operation S109 in which the filling layer and the spacer are patterned.

After operation S107, the carbon-based polymers at the boundary of the filling layer and/or the boundary of the filling layer and the spacer may be removed or partially removed. That is, the C polymer at the boundary of the filling layer is removed or partially removed, and hard C remaining at the boundary of the film layer and the spacer is removed or partially removed. Thus, the filling layer and the spacer may be subsequently patterned.

There are different implementations of performing subsequent patterning for operation S109.

Figure 8:
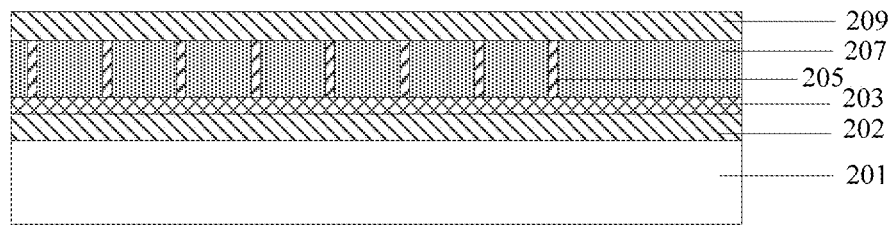
FIG. 8 shows a sixth schematic diagram of a structural change for manufacturing a semiconductor structure according to operations of FIG. 2.

In some embodiments of the disclosure, the semiconductor device forms an isolation layer on the filling layer and the spacer after operation S109. The isolation layer includes a silicon nitride layer or a silicon oxynitride layer. Therefore, the above operation includes as follows. An isolation layer 209 is formed on the surfaces of the filling layer 207 and the spacer 205 to form a structure as illustrated in FIG. 8.

Figure 9:
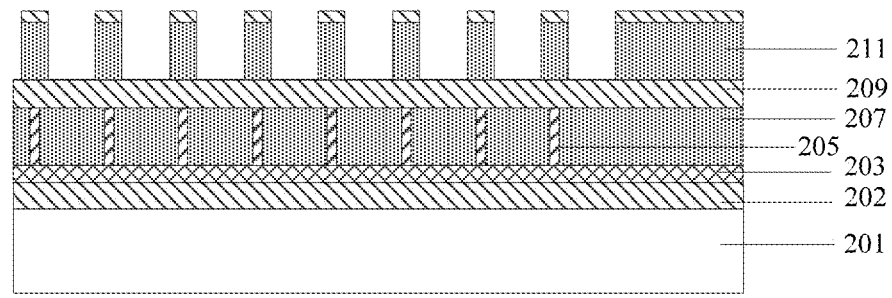
FIG. 9 shows a seventh schematic diagram of a structural change for manufacturing a semiconductor structure according to operations of FIG. 2.

Next, a mask layer 211 and a photoresist layer are formed on a surface of the isolation layer 209, and an etching process is performed to form a structure as illustrated in FIG. 9.

In some embodiments of the disclosure, the operation of forming the structure illustrated in FIG. 9 by the semiconductor device may include as follows. Firstly, a mask layer 211 is formed on the surface of the isolation layer 209. For example, a mask layer 211 is formed on the surface of the isolation layer 209 by using a CVD process. The material of the mask layer may include, but is not limited to, silicon oxynitride (SiON), polycrystalline silicon (Poly), an ACL, oxide, etc. Next, a patterned photoresist layer is formed on a surface of the mask layer 211. For example, a photoresist is spun on the mask layer 211, and the photoresist is patterned through a mask to form a patterned photoresist layer. Next, the mask layer 211 is etched by using the patterned photoresist layer to form a plurality of mask structures on the isolation layer 209. An opening is provided between every two adjacent mask structures. The opening exposes a partial region of the isolation layer 209. The mask structures may also be formed by using an SADP process on the surface of the isolation layer 209 in other embodiments. The plurality of mask structures constitute a pattern layer.

Then, the semiconductor device continuously performs a subsequent process. The filling layer 207 and the mask layer 211 are etched to form a first pattern by taking the mask structure and the spacer as an etching barrier layer, and the first pattern is continuously transferred to a base to acquire a target pattern. When the isolation layer is etched by the mask structure, if the isolation layer is bumped or the surface of the isolation layer is uneven due to the carbon-based polymers, the bumped position or the high-surface position is difficult to etch downwards when the layer is transferred downwards. Finally, the phenomenon of CD unevenness in the acquired target pattern is caused, and the product yield is affected. By removing the carbon-based polymers and acquiring a flat surface of the isolation layer, a target pattern with even CD can be acquired, so that the product yield is improved.

In some embodiments of the disclosure, an isolation layer is formed on the filling layer and the spacer after operation S109. The isolation layer includes an oxide layer.

For example, the isolation layer includes an oxide layer, the forming process thereof further includes as follows.

Figure 10:
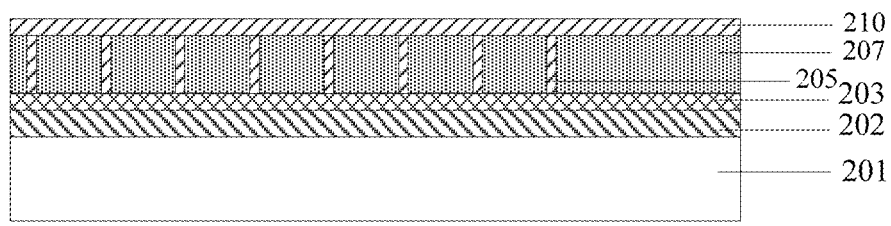
FIG. 10 shows an eighth schematic diagram of a structural change for manufacturing a semiconductor structure according to operations of FIG. 2.

Firstly, the semiconductor device forms a first isolation layer 210 on the filling layer 207 and the spacer 205 to form a structure as illustrated in FIG. 10. The first isolation layer may be formed by using CVD or SOD, and the first isolation layer has a thickness of 35 nm to 45 nm, e.g., 40 nm.

Figure 11:
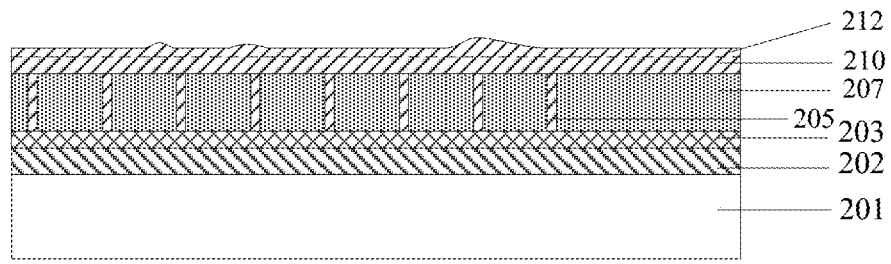
FIG. 11 shows a ninth schematic diagram of a structural change for manufacturing a semiconductor structure according to operations of FIG. 2.

Next, the semiconductor device forms a second isolation layer 212 on the first isolation layer 210 to form a structure as illustrated in FIG. 11. The second isolation layer may be formed by using SOD, and the second isolation layer has a thickness of 25 nm to 35 nm, e.g., 30 nm.

It will be appreciated that the roughness of a film layer can be effectively reduced based on the SOD process, that is, a forming process of spinning-on dielectrics on the surface of the first isolation layer 210 facilitates the planarization of the formed film layer.

This operation further includes as follows. The formed second isolation layer 212 is annealed. By annealing, the roughness of the second isolation layer 212 formed by using SOD can be improved, and the second isolation layer 212 can be densified. In some embodiments, the annealing is performed at a high temperature in the range of about 400° C. to 1100° C., which may be a wet annealing process using a gas including water vapor, O2, and H2, or a dry annealing process using a gas including N2 and O2 gases.

Figure 12:
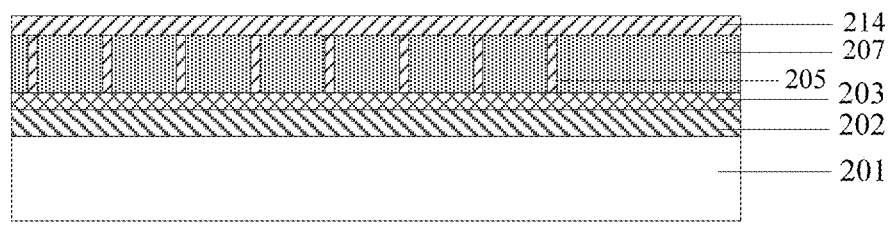
FIG. 12 shows a tenth schematic diagram of a structural change for manufacturing a semiconductor structure according to operations of FIG. 2.

Finally, the semiconductor device polishes the second isolation layer and the first isolation layer to form an isolation layer 214, and a structure as illustrated in FIG. 12 is formed. In this operation, the second isolation layer 212 formed by using SOD in the previous operation is mainly polished. After the second isolation layer is partially removed by polishing, the remaining second isolation layer and the first isolation layer constitute an isolation layer 214 having a thickness of 40 nm to 50 nm.

In some embodiments of the disclosure, a chemical mechanical polishing (CMP) process may be used to partially remove the second isolation layer by polishing, a more perfect surface can be acquired while ensuring the material removal efficiency, nano-scale to atomic-scale surface roughness can be achieved, and the flatness of the isolation layer 214 can be improved.

Figure 13:
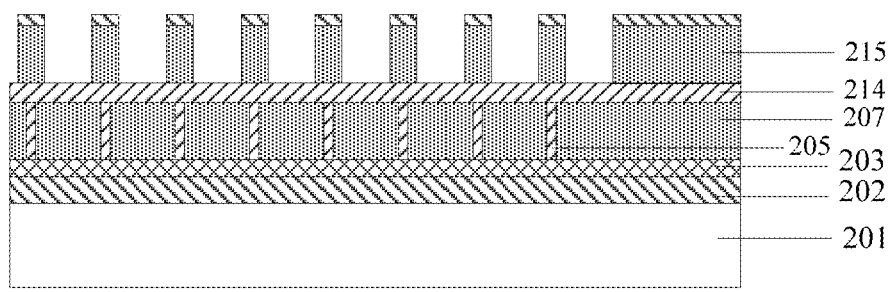
FIG. 13 shows an eleventh schematic diagram of a structural change for manufacturing a semiconductor structure according to operations of FIG. 2.

After forming the isolation layer 214 as illustrated in FIG. 12, the semiconductor device may continuously perform the following process. A mask layer 215 is formed on a surface of the isolation layer 214, and an etching process is performed to form a structure as illustrated in FIG. 13.

In some embodiments of the disclosure, the operation of forming the structure illustrated in FIG. 13 by the semiconductor device may include as follows. Firstly, a mask layer 215 is formed on the surface of the isolation layer 214. For example, a mask layer 215 is formed on the surface of the isolation layer 214 by using a CVD process. The material of the mask layer may include, but is not limited to, silicon oxynitride (SiON), polycrystalline silicon (Poly), an ACL, oxide, etc. Next, a patterned photoresist layer is formed on a surface of the mask layer 215. For example, a photoresist is spun on the mask layer 215, and the photoresist is patterned through a mask to form a patterned photoresist layer. Next, the mask layer 215 is etched by using the patterned photoresist layer to form a plurality of mask structures on the isolation layer 214. An opening is provided between every two adjacent mask structures. The opening exposes a partial region of the isolation layer 214. The mask structures may also be formed by using an SADP process on the surface of the isolation layer 209 in other embodiments. The plurality of mask structures constitute a pattern layer.

Then, the semiconductor device continuously performs a subsequent process. The filling layer 207 and the mask layer 215 are etched to form a first pattern by taking the mask structure and the spacer as an etching barrier layer, and the first pattern is continuously transferred to a base to acquire a target pattern. When the isolation layer is etched by the mask structure, if the isolation layer is bumped or the surface of the isolation layer is uneven due to the carbon-based polymers, the bumped position or the high-surface position is difficult to etch downwards when the layer is transferred downwards. Finally, the phenomenon of CD unevenness in the acquired target pattern is caused, and the product yield is affected. By removing the carbon-based polymers and acquiring a flat surface of the isolation layer, a target pattern with even CD can be acquired, so that the product yield is improved. In an embodiment, the target pattern may be a capacitance hole. In other embodiments, the target pattern may be other structural patterns.

The manufacturing method of the semiconductor structure disclosed by the disclosure includes as follows. An initial structure is provided. A filling layer covering the spacer is formed on the initial structure. A filling layer with a first preset thickness is removed at a high first etching rate through a first etching process. A filling layer with a second preset thickness is then removed at a low second etching rate through a second etching process, and the partial spacer is exposed. The filling layer and the spacer are patterned. According to the manufacturing method of the semiconductor structure, by adopting a unique two-step etching process, carbon-based polymers at a boundary of at least the partial filling layer and/or a boundary of the filling layer and the spacer can be removed, so that the stability of a subsequent process technology is facilitated, and the product quality is improved.

The above embodiments are merely illustrative of the principle and efficacy of the disclosure, and are not intended to be limiting of the disclosure. Those skilled in the art can modify or change the above embodiments without departing from the spirit and scope of the disclosure. Therefore, all equivalent modifications or changes made by a person of ordinary skill in the art without departing from the spirit and technical idea of the disclosure should be covered by the claims of the disclosure.

INDUSTRIAL APPLICABILITY

An embodiment of the disclosure provides a manufacturing method of a semiconductor structure. The method includes as follows. An initial structure is provided. A filling layer covering a spacer is formed on the initial structure. A filling layer with a first preset thickness is removed at a high first etching rate through a first etching process. A filling layer with a second preset thickness is then removed at a low second etching rate through a second etching process, and the partial spacer is exposed. The filling layer and the spacer are patterned. Through the above method, carbon-based polymers at a boundary of at least the partial filling layer and/or a boundary of the filling layer and the spacer can be removed, so that the stability of a subsequent process technology is facilitated, and the product quality is improved.

The invention claimed is:

1. A manufacturing method of a semiconductor structure, comprising:
providing an initial structure comprising a base, a mask layer formed on the base, and a spacer formed on the mask layer;
forming a filling layer covering the spacer on the initial structure;
removing a filling layer with a first preset thickness through a first etching process, wherein the remaining filling layer after the first etching process covers the spacer, and a first etching rate is adopted in the first etching process;
removing a filling layer with a second preset thickness through a second etching process, and exposing the partial spacer to remove carbon-based polymers at a boundary of at least the partial filling layer, or a boundary of the filling layer and the spacer, or the boundary of at least the partial filling layer and the boundary of the filling layer and the spacer, wherein a second etching rate is adopted in the second etching process, and the second etching rate is smaller than the first etching rate; and
patterning the filling layer and the spacer.

2. The manufacturing method of the semiconductor structure of claim 1, wherein parameters of the first etching process comprise:
an etching gas which comprises oxygen having a flow rate of 12 sccm to 18 sccm and an etching rate of 0.5 nm/s to 5 nm/s.

3. The manufacturing method of the semiconductor structure of claim 1, wherein parameters of the second etching process comprise:
an etching gas which comprises nitrogen having a flow rate of 18 sccm to 22 sccm and an etching rate of 0.1 nm/s to 0.5 nm/s.

4. The manufacturing method of the semiconductor structure of claim 1, wherein a height difference between the filling layer after the second etching process and a top of the spacer is 1 nm to 3 nm.

5. The manufacturing method of the semiconductor structure of claim 1, wherein patterning the filling layer and the spacer comprises:
forming an isolation layer on the filling layer and the spacer; and
forming a mask structure on the isolation layer.

6. The manufacturing method of the semiconductor structure of claim 5, wherein the isolation layer comprises a silicon oxynitride layer, a polycrystalline silicon layer, an amorphous carbon layer (ACL), or an oxide layer.

7. The manufacturing method of the semiconductor structure of claim 5, wherein forming the isolation layer on the filling layer and the spacer comprises:
forming a first isolation layer on the filling layer and the spacer;
forming a second isolation layer on the first isolation layer by adopting a spin-on process; and
polishing the second isolation layer and the first isolation layer to form the isolation layer.

8. The manufacturing method of the semiconductor structure of claim 7, wherein the first isolation layer has a thickness of 35 nm to 45 nm, the second isolation layer has a thickness of 25 nm to 35 nm, and the isolation layer has a thickness of 40 nm to 50 nm.

9. The manufacturing method of the semiconductor structure of claim 7, further comprising:
annealing the second isolation layer before polishing the second isolation layer and the first isolation layer.

10. The manufacturing method of the semiconductor structure of claim 5, after patterning the filling layer and the spacer, further comprising:
etching the mask layer to form a first pattern by taking the mask structure and the spacer as an etching barrier layer, and continuously transferring the first pattern to the base to acquire a target pattern.

* * * * *